United States Patent [19]

Hollars

[11] 4,421,622
[45] Dec. 20, 1983

[54] METHOD OF MAKING SPUTTERED COATINGS

[75] Inventor: Dennis R. Hollars, Franklin, Tenn.

[73] Assignee: Advanced Coating Technology, Inc., Franklin, Tenn.

[21] Appl. No.: 419,988

[22] Filed: Sep. 20, 1982

[51] Int. Cl.³ ............................................. C23C 15/00
[52] U.S. Cl. ........................... 204/192 P; 204/192 R; 204/298
[58] Field of Search ................ 204/192 P, 298, 192 R

[56] References Cited

U.S. PATENT DOCUMENTS

| | | | |
|---|---|---|---|
| 3,506,556 | 4/1970 | Gillery et al. | 204/192 P |
| 3,738,926 | 6/1973 | Westwood et al. | 204/192 P |
| 3,826,728 | 7/1974 | Chambers | 204/192 P |
| 4,022,947 | 5/1977 | Grubb | 204/192 P |
| 4,065,600 | 12/1977 | King et al. | 204/192 P |
| 4,102,768 | 7/1978 | Kearin | 204/298 |
| 4,113,599 | 9/1978 | Gillery | 204/192 P |
| 4,322,276 | 3/1982 | Meckel et al. | 204/192 P |
| 4,336,119 | 6/1982 | Gillery et al. | 204/192 P |
| 4,337,990 | 7/1982 | Fan et al. | 204/192 P |
| 4,379,040 | 4/1983 | Gillery | 204/192 P |

OTHER PUBLICATIONS

Kittler et al., SPIE, vol. 325, (1982), pp. 61-64.
Munz et al., SPIE, vol. 325, (1982), pp. 65-73.

Primary Examiner—Arthur P. Demers
Attorney, Agent, or Firm—Watts, Hoffmann, Fisher & Heinke

[57] ABSTRACT

A degradable substrate surface (e.g. a glass sheet covered by a pure metal film) is overcoated with an oxide film deposited by high rate reactive sputtering in the presence of hydrogen to avoid degradation of the substrate. The addition of hydrogen to the sputtering chamber atmosphere substantially eliminates degradation of pure metal films, etc. which would otherwise be damaged during the reactive sputtering of an oxide overcoat. The method is disclosed for producing low emissivity symmetrical three layer coatings formed on a substrate by high rate sputtering with the intermediate layer formed by a conductive silver film and the adjacent layers formed from stoichiometric tin oxide films.

Alternatively a degradable substrate surface is overcoated with an oxide film having a thickness exceeding 100 angstroms without degradation by reactively sputtering an extremely thin oxide coating onto the surface at a relatively high sputtering rate and the remainder of the oxide film is thereafter deposited over the thin initial oxide coating. A brief interval is required to enable the initial oxide film to "relax", or take a set, before the additional film is deposited.

14 Claims, 4 Drawing Figures

METHOD OF MAKING SPUTTERED COATINGS

DESCRIPTION

1. Technical Field

The present invention relates to methods of reactively sputtering oxide coatings over degradable substrate surfaces and more particularly to methods of making low emissivity coatings for architectural glass wherein oxide coatings are sputtered over degradable metal coatings.

2. Background Art

Architectural glass radiates heat from buildings and thus represents a significant form of radiation heat loss. It has been found that window glass having an electrically conductive coating emits far less radiation than identical uncoated window glass. Accordingly, the prior art has proposed various low emissivity coatings for architectural glass.

The coatings proposed by the prior art have not been entirely satisfactory in a number of respects. In some cases the coatings have not been adequately durable and thus have been subject to mechanical failures such as bubbling and peeling. In other cases the coatings have not met optical requirements of users. For example, some low emissivity coatings have not transmitted light adequately or have had undesirable reflected or transmitted colors, making the glass appear to be colored in a way unsuitable to the end user. Other coatings have been found to be unstable in that the emissivity rises over time reducing the effectiveness of the glass and various optical changes occur.

Generally speaking, low emissivity coatings proposed in the past have consisted of coatings formed by gold, silver, doped wide band semiconductors (such as nonstoichiometric indium oxide or indium-tin oxide) or by conductive metal films (gold, silver or copper) formed as laminants with one or more metal oxide films.

The pure metal coatings have generally been expensive and not suitably transparent. The doped semiconductors have not been stable unless shielded from the atmosphere and exhibit colors in transmission or reflection. The multilayer coatings have exhibited colors in transmission and reflection, have tended to be unstable unless shielded from the atmosphere, have not exhibited sufficiently low emissivity levels and in many cases have not been transparent enough.

While different manufacturing techniques can and have been employed to produce coatings of the general character referred to, high rate cathodic sputtering has emerged as the most practical manner of producing commercial grade coated glass in adequate quantities. The multilayer coatings have sometimes presented production problems because the pure metal films have been partially oxidized or otherwise degraded during deposition of the metal oxide overcoats by high rate sputtering.

The cause of the degradation is generally considered to be the oxygen atmosphere in which sputtering an oxide film necessarily takes place. The exact mechanism by which the substrate degradation takes place is not known; but is considered to comprise oxidation of the substrate material, and/or mixing of the substrate material with the oxide layer, and/or diffusion of material across the substrate-oxide interface. The result of the degradation is a pronounced and usually unacceptably great increase in the resistivity of the pure metal film which adversely affects both the emissivity of the coating and the optical properties. Coatings which exhibited acceptable electrical properties normally exhibit colors in reflection and transmission which are not always desirable.

The prior art has dealt with this problem in a number of ways. In some proposals the pure metal films have been protected from the reactive sputtering process by protective films of still another material deposited by nonreactive sputtering. Others have attempted to magnetically restrict the plasma so that it does not contact the metal film, and/or have increased the distance between the sputtering cathode and the substrate during the reactive sputtering process.

The prior art approaches have not solved the problems attendant depositing oxide coatings over degradable substrate surfaces by reactive sputtering.

DISCLOSURE OF THE INVENTION

The present invention provides a new and improved method for depositing oxide coatings on degradable substrate surfaces by reactive sputtering which is particularly effective for producing highly effective low emissivity coatings for transparent substrates.

According to a preferred embodiment of the invention an oxide film is deposited on a degradable substrate (e.g. a glass sheet covered by a pure metal film) by high rate reactive sputtering in the presence of hydrogen to avoid degradation of the substrate. It has been found that the addition of hydrogen to the sputtering chamber atmosphere substantially eliminates degradation of pure metal films which would otherwise be damaged during the reactive sputtering of an oxide overcoat.

This new method is particularly useful in applying stoichiometric oxide films over a pure metal film because the relatively great amount of oxygen in the sputtering atmosphere otherwise causes rapid degradation of the pure metal film. The method can also be applied to systems where a pure metal film is overcoated by a nonstoichiometric oxide film since, even though atmospheric oxygen is restricted, degradation of the pure metal film can still be experienced. For this reason the method could be practiced in connection with production of semiconductor materials as well as in producing aforementioned products.

The new method has been used to produce low emissivity symmetrical three layer coatings formed on a substrate by high rate sputtering with the intermediate layer formed by a conductive silver film and the adjacent layers formed from stoichiometric tin oxide films. These coatings exhibit at least an 80% transmissivity to light having a wavelength of 550 nm, are substantially colorless in reflection and transmission and have low emissivities of 0.2 or less. The coatings are stable over time, extremely durable and relatively inexpensive to produce. The coatings are particularly adapted for use on architectural glass panels; but can be used effectively in other environments such as plastic film heat mirrors, solar collectors, green house covers and so forth.

According to another embodiment of the invention a degradable substrate is overcoated with an oxide film having a thickness exceeding 100 angstroms without degradation wherein an extremely thin oxide coating is reactively sputtered onto the substrate at a relatively high sputtering rate and the remainder of the oxide film is thereafter deposited over the thin initial oxide coating. It has been found that reactive deposition of a thin oxide layer on a degradable substrate can be accomplished without any appreciable substrate degradation. The thin oxide layer then serves to protect the underlying substrate from degradation during deposition of the remainder of the oxide coating. A brief interval is required to enable the initial oxide film to "relax", or take a set, after which the film effectively protects the substrate from degradation during further sputtering.

This method has been discovered to be particularly effective when stoichiometric metal oxide coatings are sputtered onto an underlying pure metal film in oxygen rich atmospheres. The method can be used as an alternative to or in combination with introduction of hydrogen into the sputtering atmosphere.

Other features and advantages of the invention will become apparent from the following description and from the drawings which form part of the specification.

BEST MODE FOR CARRYING OUT THE INVENTION

Figure 1:
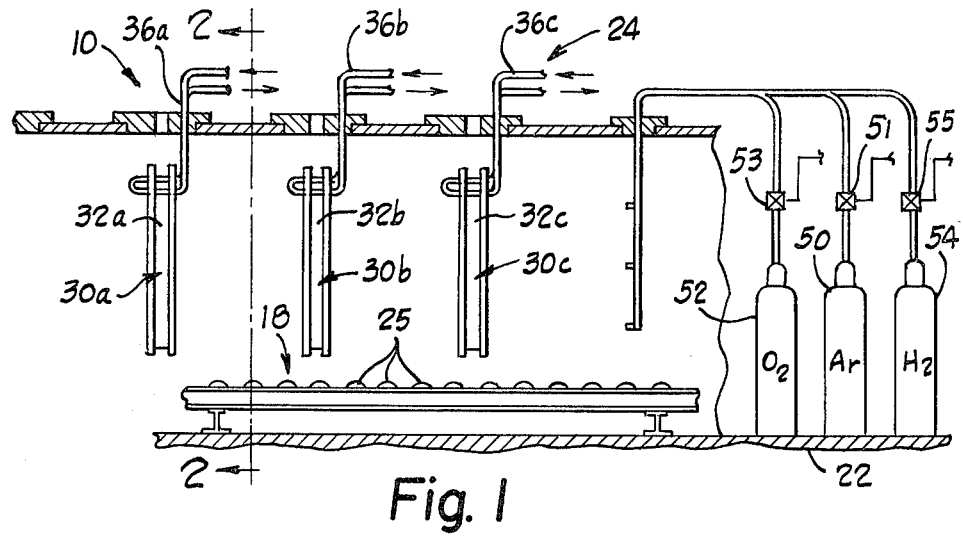
FIG. 1 is a schematic cross-sectional view of a portion of a coating system utilized in connection with the present invention.
Figure 2:
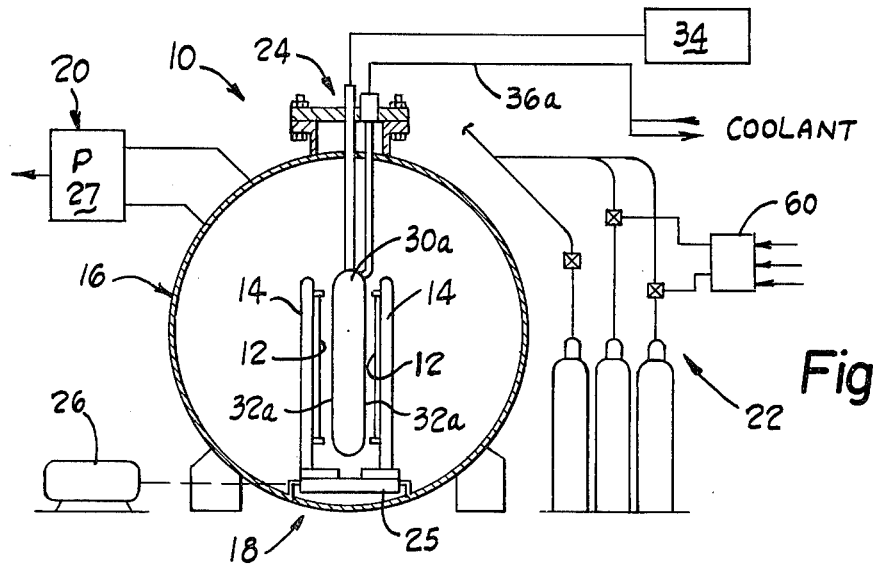
FIG. 2 is a cross-sectional view seen approximately from the plane indicated by the line 2—2 of FIG. 1.

A coating system 10 constructed according to the present invention is schematically illustrated in FIGS. 1 and 2 of the drawings. The system 10 is illustrated and described as being operated to deposit low emissivity coatings on architechtural glass sheets 12 (FIG. 2) supported by racks or frames 14 which are conveyed through a coating chamber 16 by a conveyor system 18. The coating chamber 16 is maintained under a deep vacuum pressure by a pumping system 20. An atmosphere supply system 22 associated with the chamber 16 supplies controlled flows of selected gases to the chamber so that the chamber contains a controlled low pressure atmosphere. The pumping system 20 operates substantially continuously so that a through flow of the low pressure atmosphere is maintained during the coating process. A sputtering system, generally indicated by the reference character 24, is associated with the chamber for coating glass sheets in the chamber by high rate sputtering.

The glass sheet supporting racks 14 can be of any suitable or conventional construction and are therefore illustrated schematically. In the coating system 10, the racks 14 are arranged in pairs so that glass sheets on each rack of each pair are simultaneously coated in the chamber 16. The coating chamber is formed by a suitable pressure vessel which can be constructed, for example, like the coating chamber illustrated and described in U.S. Pat. No. 4,274,936, the disclosure of which is incorporated herein in its entirety by this reference to it.

The conveyor system 18 is formed by a series of rolls 25 which are supported in the coating chamber and driven from a variable speed reversible electric motor 26 (FIG. 2) by a chain or other suitable transmission. The speed of the motor 26 is controllable by an operator of the system. The rolls 25 are effective to move the sheets along predetermined paths of travel through the chamber at speeds determined by the speed of the motor 26.

The pumping system 20 is schematically illustrated and preferably includes an oil diffusion pump 27 communicated with the chamber 16 by a suitable duct. The pump 27 has sufficient capacity to pump the coating chamber 16 down to a pressure of a fraction of a micron; but the pump intake is suitably throttled so that the chamber is maintained at a pressure of from 2 to 5 microns with an adequately large gas flow through the chamber to accommodate the coating process being undertaken.

The sputtering system 24 is formed by a plurality of magnetron cathodes three of which are illustrated and indicated by the reference characters 30a, 30b, 30c. Each of the cathodes carries respective sputtering targets 32a, 32b and 32c formed of material to be applied to the glass sheets 12. The cathodes are each constructed to incorporate magnets (not illustrated) which establish a magnetic field for restricting the plasma created by the cathode and ionizing gas in the chamber to a region extending adjacent the cathode target. Hence the term "magnetron".

Each magnetron cathode is connected to a respective electric power supply, only one of which is illustrated in FIG. 2 by the reference character 34. Each cathode is cooled by water, or some other suitable coolant, through respective supply lines 36a, 36b, 36c. Anodes for the respective magnetron cathodes are not illustrated but can be placed adjacent the respective cathodes if desirable and convenient.

Each of the magnetron cathodes 30 is constructed like the cathode disclosed by U.S. Pat. No. 4,194,962 the disclosure of which is hereby incorporated herein by this reference to it. That patent should be consulted for further structural details of the cathodes 30.

It should be appreciated that the present invention can be practiced in high rate sputtering systems constructed differently from the system 10. The system 10 is illustrated and described for convenience of disclosure. Other types of high rate sputtering systems usable to practice the invention are for example, horizontal systems in which substrates are conveyed through the system in a horizontal plane on pallets or a belt with the cathodes supported above the path of travel. Likewise although a single coating chamber is disclosed, the invention can be practiced in high rate sputtering systems where distinct films are deposited in respective ones of successive coating chambers. Different cathodes can be employed such as "sputter guns", "post electrodes" and so forth.

Figures 3, 4:
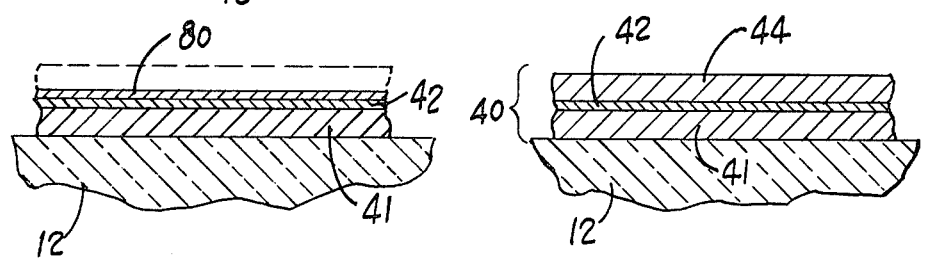
FIG. 3 is a cross-sectional view of a low emissivity coating embodying the present invention.
FIG. 4 is a cross-sectional view of a part of a coating embodying the invention.

In the illustrated embodiment the magnetron cathodes are utilized to provide for the deposition of a three layer coating on the glass sheets 12. The magnetron cathodes 30a, 30b are simultaneously operated to deposit an oxide film while the magnetron 30c deposits a pure metal film on the glass. More particularly, the coating system 10, operated according to the invention, is illustrated and described as producing a symmetrical three layer low emissivity coating 40 on the glass sheets 12 (see FIG. 3) including a base film 41 of stoichiometric tin oxide ($SnO_2$) extending over the glass surface, a pure silver intermediate film 42 overlying the base film 41 and a stoichiometric tin oxide ($SnO_2$) outer film 44 covering the film 42.

Tin oxide-silver-tin oxide coatings produced according to the invention exhibit a low emissivity (i.e. an emissivity less than 0.2), a transmissivity of greater than 80% to light having a wavelength of 550 nanometers (i.e. in the middle of the visible light spectrum) and a high degree of color neutrality, which is to say the coating does not appear colored when transmitting or reflecting "white" light. On the C.I.E. scale the reflected purity is less than 10% and the transmitted purity is less than 5%. At these purity levels the normal human eye can not distinguish colors in transmission and reflection and when the new coating is applied to a glass light of a dual pane panel any suggestion of color is completely masked by the glass.

There are a number of reasons for the optical performance of the coating. The tin oxide films 41, 44 are substantially pure $SnO_2$ as distinguished from nonstoichiometric tin oxide coatings formed by mixtures of SnO and $SnO_2$. Nonstoichiometric tin oxide coatings exhibit light absorbtion and are noticeably colored in transmission and reflection. Stoichiometric tin oxide films, on the other hand, do not exhibit material light absorption in the visible spectrum. Moreover the stoichiometric tin oxide films coact with the light absorption silver film to effectively reduce reflection from the silver film and thus increase the amount of light transmitted by the silver film. The thickness of the films 41, 44 is controlled to range from 300–500 angstroms and preferably about 400 angstroms to maximize the enhanced light transmission through the silver film 42 as well as to provide physical protection for the silver film.

The silver film is quite thin (i.e. from 50–120 angstroms and preferably about 80 angstroms) which assures high light transmission. Silver films exhibit relatively uniform transmission of light throughout the visible spectrum so the silver film does not impart any significant coloring to the coatings by acting as a filter to certain visible light frequencies. The silver in the film 42 is agglomerated, or coalesced, into a continuous mass and therefore has an electrical resistivity from 2 to 20 ohms per square, preferably around 10 ohms per square.

Fabrication of the coating 40 can be accomplished in the following manner. The glass 12 is loaded into the coating chamber and the pumping system is operated to evacuate the system to between 4 and 5 microns. The atmosphere supply system 22 is operated to introduce flows of oxygen, argon, and hydrogen into the chamber. As illustrated by FIG. 2 the atmosphere supply system includes an argon tank 50 and associated argon control valve 51, an oxygen tank 52 and associated oxygen control valve 53 and hydrogen tank 54 and associated control valve 55 for that tank.

The valves 51, 53 and 55 are operatively connected to a valve controller 60 (schematically illustrated) which actuates the respective valves to modulate the respective flows of argon, oxygen and hydrogen into the system. The controller 60 can be operated from conventional or suitable state of the art pressure responsive sensing devices, or from mass spectrometers, emission spectrographic equipment or relevant electrical signals otherwise derived from the system. In any event the controller 60 individually operates the control valves in response to individual respective input signals to maintain the system atmosphere at a desired blend.

The cathodes 30a, 30b are energized from their respective power supplies while the cathode 30c remains deenergized. The operating parameters for high rate sputtering systems vary substantially depending on the geometry of various parts of the system, such as the size of the cathodes and the dimensions of the coating chamber itself. In the preferred and illustrated system, the cathodes 30a, 30b are each operated at about 370 volts and 15 amps. The argon partial pressure is maintained at about 3.3 microns while the oxygen partial pressure is maintained at about 1.2 microns. The hydrogen partial pressure is virtually undetectable in the atmosphere (perhaps 0.1 microns). The hydrogen flow control valve 55 is positioned to maintain a flow rate of the hydrogen between 30 and 100 standard centimeters per minute during the process.

The glass sheets 12 move past the cathodes 30a, 30b and tin oxide is deposited onto the glass substrates during this deposition "pass". The sputtering atmosphere is oxygen rich to assure that the tin oxide film is stoichiometric. The conveyor system motor 26 operates so that the glass passes the cathodes at a rate of about two feet per minute. The sputtering rate is sufficiently high that after a single pass the tin oxide coating thickness is about 400 angstroms when the system is operated as noted.

After the base film 41 is applied, the oxygen and hydrogen supply valves are closed and the remaining oxygen and hydrogen in the chamber atmosphere is exhausted from the chamber. The argon flow rate is adjusted to maintain a pressure of 3.3 microns in the chamber and the cathode 30c is then energized from the power supply at about 500 volts and 6 amps so that the silver target is sputtered in the presence of argon gas only. The sheets 12 are conveyed past the cathode 30c at a rate of about 5 feet per minute which provides for deposition of about an 80 angstrom thick silver film on the substrates after a single pass. As noted the silver film is continuous and completely covers the tin oxide surface of the substrate.

The oxide film 44 is deposited over the silver surface of the substrate in substantially the same way the film 41 is applied. Thus the oxygen and hydrogen flows are reestablished into the chamber and the cathodes 30a, 30b are reenergized. The sheets 12 are then conveyed past the electrodes 30a, 30b at about 2 feet per minute to establish an outer film 44 of stoichiometric tin oxide about 400 angstroms thick.

The introduction of hydrogen to the coating chamber atmosphere is particularly beneficial in permitting deposition of the outer film 44 without degrading the underlying pure silver film 42. Since a plasma is not a system in which the energies of all particles can be described by a single temperature, the system is, by definition, not in thermal equilibrium. For this reason it is extremely difficult to apply the usual chemical and physical principles to explain observed reactions. However, although subject to the uncertainties referred to, the following theory supports the results obtained by the new process.

Much of the literature relating to reactive sputtering and deposition suggests that the reaction takes place on the substrate in order to conserve energy and momentum, since it is otherwise difficult to explain what happens to the liberated reaction energy in a two body collision. A third particle is needed to make the equations balance; but in low density plasma the particles are not close together on an atomic scale so it is thought that reactions do not take place there. It seems desirable that the reactions take place in the plasma as well as on the substrate.

Furthermore it is believed that the existance of oxygen ions in the plasma is responsible for degradation of thin films overcoated by oxide films in reactive sputtering processes. It follows that if the oxygen ions should be somehow eliminated, substrate degradation would be minimized. The presence of hydrogen gives rise to the formation of OH radicals in the plasma and is believed to enable oxidation reactions in the plasma while reducing the oxygen ion population.

It is believed that oxygen ions are depleted by the following reaction.

$$O^- + H_2 \rightarrow H_2O + e^-$$

where the emitted electron carries away the reaction energy.

The water molecule is then disassociated by the glow discharge in the plasma to produce the OH radical $$H_2O + photons \rightarrow OH + H$$

The tin may now react with the OH in the plasma to help drive the oxide to complete stoichiometry through $$Sn + OH \rightarrow SnO + H$$

where the hydrogen carries away the reaction energy.

Repeating the process $$SnO + OH \rightarrow SnO_2 + H$$

then yields the stoichiometric tin oxide with the oxygen ions being simultaneously reduced and the hydrogen again carrying away the reaction energy.

It is not believed that the foregoing is necessarily the only series of reactions taking place; however, it does appear possible that this reaction process provides for deposition of stoichiometric tin oxide film over the thin silver film without disruption of the silver.

In addition to the improvements in the intermediate silver film after application of the tin oxide overcoat, the hydrogen in the sputtering atmosphere is believed to enhance oxide coating uniformity on the glass.

The introduction of hydrogen to the coating system results in high rate sputtering of high quality oxide films in an oxygen rich atmosphere without any appreciable degradation of the substrate surface. The hydrogen reacts with the oxygen supplied to the system and not with the substrate or the cathode target material. The hydrogen thus functions as a catalyst in the reactive sputtering process.

The benefits of supplying hydrogen are not limited to the deposition of tin oxide films over silver films. For example, the method described here has been successfully employed in connection with the application of indium oxide and indium-tin oxide films applied over thin pure metal silver films. Similarly, thin copper films have been overcoated by metal oxide films without any apparent degradation.

Parenthetically, the reason why the hydrogen partial pressure is so low results from the hydrogen combining with oxygen in the manner indicated. The hydrogen appears to be pumped from the chamber in the form of water molecules since no buildup of hydrogen gas is observed in the system over time.

An alternative method enables producing the coating 40 with or without introducing hydrogen into the coating chamber. According to the alternative method embodying the invention the film 41 is applied to the sheets 12 under the conditions referred to; but without introducing hydrogen to the chamber atmosphere. The oxygen supplied is sufficient to assure deposition of the stoichiometric tin oxide film and the glass surface itself is not subject to degradation in the oxygen rich atmosphere.

The pure silver film 42 is deposited in the manner described previously.

The coating chamber is again supplied with oxygen and the cathodes 30a, 30b are energized to provide for high rate reactive sputtering of stoichiometric tin oxide the same as described previously; except, again, that hydrogen need not be introduced to the chamber. The partially coated sheets are then conveyed past the cathodes at a rate of about 20 feet per minute resulting in the application of a tin oxide film 80 (see FIG. 4) completely covering the silver film 42 and having a thickness of about 40 angstroms. The conveyor speed is then reset to advance the sheet past the cathode at a lower speed, ranging from about 1.8 to 2.0 feet per minute, to enable application of the remainder of the tin oxide film 44.

The high speed application of the oxide film 80 is accomplished without any material degradation of the underlying silver film even though the sputtering takes place in an oxygen rich atmosphere and the oxide film is stoichiometric. Moreover, the oxide film 80 overlying the silver film protects the silver film from degradation during the second or any subsequent oxide film deposition passes.

The precise reason, or reasons, why the silver film remains undisturbed during deposition of the initial oxide film is not completely understood. For example, if a 400 angstrom thick film of stoichiometric tin oxide is applied by high rate sputtering over a silver film, the silver film is usually significantly degraded by the process (for example the resistivity of the silver film can increase from 10 ohms per square or less to the range of 30–100 ohms per square).

It is logical to assume that the silver film would not degrade after the initial 40 angstroms of a 400 angstrom thick film is deposited over the silver film. Therefore the essential absence of silver film degradation experienced during high rate sputtering of about a 40 angstrom thick tin oxide film is surprising and unforeseeable.

It is theorized that the time interval between deposition of the initial oxide film and deposition of the remainder of the oxide film enables the thin oxide film and/or the silver film beneath it to relax and stabilize, or set up, before being exposed again to the plasma. The oxide film, even though thin, is, for all intents and purposes, immune to degradation during reactive sputtering with oxygen and thus fully protects the underlying degradable material. In any event, use of this technique has typically been found effective to raise the silver film resistivity only one or two ohms per square (indicating virtually no degradation of the silver film) as distinguished from increases of from 30 to 100 ohms per square experienced when an identical silver film is overcoated with greater than a 100 angstrom stoichiometric tin oxide film in a single pass. While the initial film thickness is preferably 40 angstroms, the initial film thickness can vary between about 80 angstroms and 20 angstroms and still protect the degradable substrate is described.

It should be appreciated that the "initial oxide film" deposition process can be practiced with any oxide film deposition carried out in an oxygen rich atmosphere where the underlying substrate can be degraded. The process can also be employed using sputtering cathodes spaced apart in the direction of movement of the glass sheets. The first cathode is effective to deposit the initial oxide film and the succeeding cathode, or cathodes, apply the remainder of the desired oxide overcoat. The cathodes must be separated sufficiently that the initial oxide film has time to stabilize before being exposed to the plasma from the subsequent cathodes. By the same token, the process can be practiced in a system where a degradable substrate and cathode are fixed with respect to each other simply by depositing the initial oxide layer, discontinuing sputtering for an interval to allow the initial oxide film to stabilize and then sputtering the remainder of the oxide film onto the substrate.

It should also be appreciated that the "initial oxide film" procedure can be employed when hydrogen is being introduced into the coating system so that the benefits of both procedures can be realized if that should be desirable.

While new and improved methods for reactively sputtering oxide films onto degradable substrate surfaces have been illustrated and described in considerable detail, the invention is not to be considered limited to the precise methods disclosed. Various adaptations, modifications and uses of the invention may occur to those skilled in the art to which the invention relates and the intention is to cover all such adaptations, modifications and uses which fall within the scope or spirit of the appended claims.

I claim:

1. A method of making a low emissivity architectural glass panel comprising:
   (a) depositing a silver film on a substrate, said silver film having a resistivity of from 2 to 20 ohms per square;
   (b) reactively sputtering a metal oxide film over said silver film comprising:
      (i) providing a low pressure atmosphere containing a predetermined amount of oxygen and an ionizing gas;
      (ii) establishing a plasma in the atmosphere adjacent a sputtering target formed of said metal;
      (iii) reacting the target metal with the oxygen to form a stoichiometric metal oxide coating on the substrate;
      (iv) depositing a first film layer of stoichiometric metal oxide on said substrate having a thickness of from 20-80 angstroms;
      (v) discontinuing exposure of said first oxide film to the plasma for at least a brief interval; and,
      (vi) depositing a second film layer of said stoichiometric metal oxide on said substrate.

2. The method claimed in claim 1 further including introducing hydrogen gas into said atmosphere while depositing said metal oxide film.

3. A method of making low emissivity transparent panels comprising:
   (a) depositing a film of silver on a transparent substrate, said silver film having a resistivity of from 2-20 ohms per square;
   (b) reactively sputtering a metal oxide coating over said silver film comprising:
      (i) providing a low pressure atmosphere containing a predetermined amount of oxygen and an ionizing gas;
      (ii) energizing a magnetron cathode in said atmosphere to sputter metal from the cathode target formed from said metal; and
      (iii) introducing hydrogen gas into said atmosphere and reacting the hydrogen gas with said atmosphere adjacent the cathode to minimize degradation of said silver film by the reactive sputtering process.

4. The method claimed in claim 3 wherein providing oxygen to said atmosphere comprises controlling the flow of oxygen to said atmosphere to a level which produces a stoichiometric metal oxide on the substrate.

5. A method of reactively sputtering an oxide film on a substrate surface which is degraded by exposure to a reactive sputtering process wherein a cathode target comprised of a reaction material is exposed to an ionizing gas and oxygen to produce a plasma adjacent the target, the improvement comprising protecting the substrate from degradation by introducing a catalyst gas into the sputtering process, associating the catalyst with oxygen ions between the substrate and the target, associating oxygen ions and the catalyst with the reaction material, and disassociating the catalyst from the reacton material to produce an oxide film on the substrate which is substantially devoid of catalyst and to reduce exposure of the degradable surface to oxygen ions.

6. A method of coating a degradable substrate with an oxide film by reactive sputtering wherein a cathode target formed by a reaction material is stationed in a sputtering chamber, energized from a power supply and exposed to oxygen and an ionizing gas to deposit oxidized target material on the substrate, the improvement comprising introducing hydrogen into the region between the target and the substrate, and associating the hydrogen with oxygen ions adjacent the target to minimize degradation of the substrate due to exposure to oxygen ions while promoting oxidation of the target material.

7. The method claimed in claim 6 further including stationing a tin reaction material target on said cathode.

8. The method claimed in claim 6 further including stationing an indium reaction material target on said cathode.

9. The method claimed in claim 6 further including stationing an indium tin reaction material target on said cathode.

10. The method claimed in claim 6 wherein oxygen is supplied to said chamber at a flow rate sufficient to provide a stoichiometric reaction with the reaction material.

11. A method of reactively sputtering an oxide film on a degradable substrate surface which is degraded by exposure to a reactive sputtering process wherein a cathode target comprised of a reaction material is exposed to an ionizing gas and oxygen to produce a plasma adjacent the target, the improvement comprising reactively sputtering an initial oxide film onto said surface to a thickness no greater than about 80 angstroms, momentarily discontinuing exposure of the initial film to the plasma and thereafter reactively sputtering an additional oxide film over said initial film.

12. The method claimed in claim 11 wherein the substrate is a transparent substrate, said oxide films are stoichiometric metal oxides and further including controlling the oxygen supplied during said reactive sputtering to assure stoichiometry of said oxide films.

13. The method claimed in claim 11 wherein reactively sputtering the initial oxide film and reactively sputtering the additional film comprises sputtering a metal from a cathode target so that both oxide films are the same composition.

14. The method claimed in claim 11 wherein sputtering said initial and additional oxide films includes sputtering said films from a common sputtering cathode.

* * * * *